(12) United States Patent
Mohr et al.

(10) Patent No.: US 10,980,136 B2
(45) Date of Patent: Apr. 13, 2021

(54) MULTI-LAYERED PRINTED CIRCUIT BOARD

(71) Applicant: HEWLETT-PACKARD DEVELOPMENT COMPANY, L.P., Houston, TX (US)

(72) Inventors: Adilson Arthur Mohr, Porto Alegre (BR); Roberto Pereira Silveira, Porto Alegre (BR)

(73) Assignee: Hewlett-Packard Development Company, L.P., Spring, TX (US)

( * ) Notice: Subject to any disclaimer, the term of this patent is extended or adjusted under 35 U.S.C. 154(b) by 79 days.

(21) Appl. No.: 16/076,337

(22) PCT Filed: Jan. 17, 2017

(86) PCT No.: PCT/US2017/013751
§ 371 (c)(1),
(2) Date: Aug. 8, 2018

(87) PCT Pub. No.: WO2018/136036
PCT Pub. Date: Jul. 26, 2018

(65) Prior Publication Data
US 2019/0045639 A1    Feb. 7, 2019

(51) Int. Cl.
*H05K 3/00* (2006.01)
*H05K 3/46* (2006.01)
(Continued)

(52) U.S. Cl.
CPC .......... *H05K 3/4664* (2013.01); *B41M 3/006* (2013.01); *H05K 3/125* (2013.01); *H05K 1/0393* (2013.01);
(Continued)

(58) Field of Classification Search
CPC .............. H05K 3/00; H05K 1/00; B41M 3/00
See application file for complete search history.

(56) References Cited

U.S. PATENT DOCUMENTS 4,851,614 A * 7/1989 Duncan, Jr. .......... H05K 1/0215
174/263
6,548,767 B1    4/2003 Lee et al.
(Continued)

FOREIGN PATENT DOCUMENTS

KR    20080011555 A    2/2008
WO    2016077844 A1    5/2016
WO    WO-2016185215 A1 * 11/2016 .......... H05K 3/4682

OTHER PUBLICATIONS

"Are there any DIY Solutions for Multilayer PCB Fabrication?", Retrieved from Internet—https://www.quora.com/Are-there-any-DIY-solutions-for-multilayer-PCB-fabrication, 2012, 2 Pages.
(Continued)

*Primary Examiner* — Gordon Baldwin
*Assistant Examiner* — Mohammad Mayy
(74) *Attorney, Agent, or Firm* — Fabian VanCott

(57) ABSTRACT

A method of forming a multi-layered printed circuit board (PCB) may include, with a printing device, delivering a flexible medium to at least one fluid jet printhead. Printing an electrically conductive fluid on the flexible medium may be performed with at least one fluid jet printhead, to form a first conductive layer on the flexible medium. With the at least one fluid jet printhead, an electrically insulating fluid may be printed on the first conductive layer to form at least one insulating layer on the first conductive layer. With the at least one fluid jet printhead, the electrically conductive fluid may be printed on the at least one insulating layer to form a second conductive layer.

16 Claims, 9 Drawing Sheets

(51) Int. Cl.
*B41M 3/00* (2006.01)
*H05K 3/12* (2006.01)
*H05K 1/03* (2006.01)
*H05K 3/40* (2006.01)

(52) U.S. Cl.
CPC ......... *H05K 3/0005* (2013.01); *H05K 3/1241* (2013.01); *H05K 3/4038* (2013.01); *H05K 2203/013* (2013.01); *H05K 2203/0143* (2013.01); *H05K 2203/1545* (2013.01)

(56) References Cited

U.S. PATENT DOCUMENTS

| | | | |
|---|---|---|---|
| 7,668,487 | B2 | 2/2010 | Sharma et al. |
| 7,834,274 | B2 | 11/2010 | Yang et al. |
| 2004/0145088 | A1* | 7/2004 | Patel ............... B29C 41/003 264/463 |
| 2006/0098069 | A1* | 5/2006 | Cornell ............ C09D 11/322 347/101 |
| 2008/0070011 | A1 | 3/2008 | Oh et al. |
| 2008/0308037 | A1* | 12/2008 | Bulovic ........... B05B 17/0638 118/302 |
| 2009/0263162 | A1* | 10/2009 | Sharma ............ H04L 45/00 399/237 |
| 2015/0197062 | A1 | 7/2015 | Shinar et al. |
| 2018/0154573 | A1* | 6/2018 | Miles ............... B33Y 80/00 |

OTHER PUBLICATIONS

Dannewoo, "How to Etch a PCB", Retrieved from Internet—https://www.instructables.com/id/How-to-Etch-a-PCB/, 2016, 4 Pages.
"Dragonfly 2020 3D Printing Platform for Electronics", Retrieved from Internet—https://www.nano-di.com/, 2016, 2 Pages.
"DuPont Conductive Inks for Digital Printing", Retrieved from Internet—http://www.dupont.com/products-and-services/electronic-electrical-materials/printed-electronics/products/inkjet-silver-conductor-inks.html, 2016, 2 Pages.
"DuPont Electronic Inks Cure Quickly at Low Temperatures", Retrieved from Internet—http://www.dupont.com/products-and-services/electronic-electrical-materials/printed-electronics/products/low-temperature-electronic-inks.html, 2016, 2 Pages.
"High Performance Flexible Films for Photovoltaic Substrates", Kapton®, 2016, 1 Page.
"Stretchable Encapsulant for Wearables", Retrieved from Internet—http://www.dupont.com/content/dam/dupont/products-and-services/electronic-and-electrical-materials/documents/prodlib/PE772.pdf, 2014, 2 Pages.
"Home Brew Multi Layer PCBs?", Retrieved from Internet—https://forum.allaboutcircuits.com/threads/home-brew-multi-layer-pcbs.49695/, 2011, 16 Pages.
Marsh, "New Technique to Print Ink-Based Electrical Circuitry Using a Desktop Printer", Retrieved from Internet—https://newatlas.com/georgia-tech-inkjet-printable-circuits/29731/, Nov. 11, 2013, 7 Pages.
"Conductive & Resistive Inks", Retrieved from Internet—http://www.methode.com/sensors-and-switches/conductive-and-resistive-inks.html, 2016, 3 Pages.
"Silver Nano Inkjet System", Retrieved from Internet—http://diamond-jet.com/silvernanoinkjetsystem.aspx, 2016, 2 Pages.
"Inkjet Inks", NovaCentrix, Retrieved from Internet—http://www.novacentrix.com/products/metalon-inks/inkjet, 2016, 6 Pages.
Jackson, "Understanding PCB Manufacturing: Multilayer Assembly", The Circuit Board, Retrieved from Internet—http://www.omnicircuitboards.com/blog/bid/289774/Understanding-PCB-Manufacturing-Multilayer-Assembly, May 9, 2013, 5 Pages.
Dunki, "Cheap, Friendly, and Precise PCB Etching; Makezine", Retrieved from Internet—https://makezine.com/projects/cheap-friendly-and-precise-pcb-etching/, 2016, 4 Pages.
"PCB Basics", Sparkfun, Retrieved from Internet—https://learn.sparkfun.com/tutorials/pcb-basics, 2016, 11 Pages.
"TECHDOCS", ADRR, Retrieved from Internet—https://www.altium.com/documentation/18.1/display/ADES/PCB_Obj-Via((Via))_AD, 2013, 4 Pages.
"Multilayer PCB Prototyping", Think & Tinker, Ltd., Retrieved from Internet—http://www.thinktink.com/stack/volumes/volvi/multilyr.htm, 2016, 3 Pages.
"How to Etch a Circuit Board", Retrieved from Internet—https://www.wikihow.com/Etch-a-Circuit-Board, 2016, 2 Pages.

* cited by examiner

MULTI-LAYERED PRINTED CIRCUIT BOARD

BACKGROUND

A printed circuit board (PCB) is any device that mechanically supports and electrically connects electronic components using conductive tracks, pads, vias, and other features. In some examples, the conductive tracks, pads, vias, and other features may be formed by etching copper sheets laminated onto a non-conductive substrate. Electrical elements such as capacitors, resistors, inductors, memristors, or active devices may be soldered on the PCB or embedded therein.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
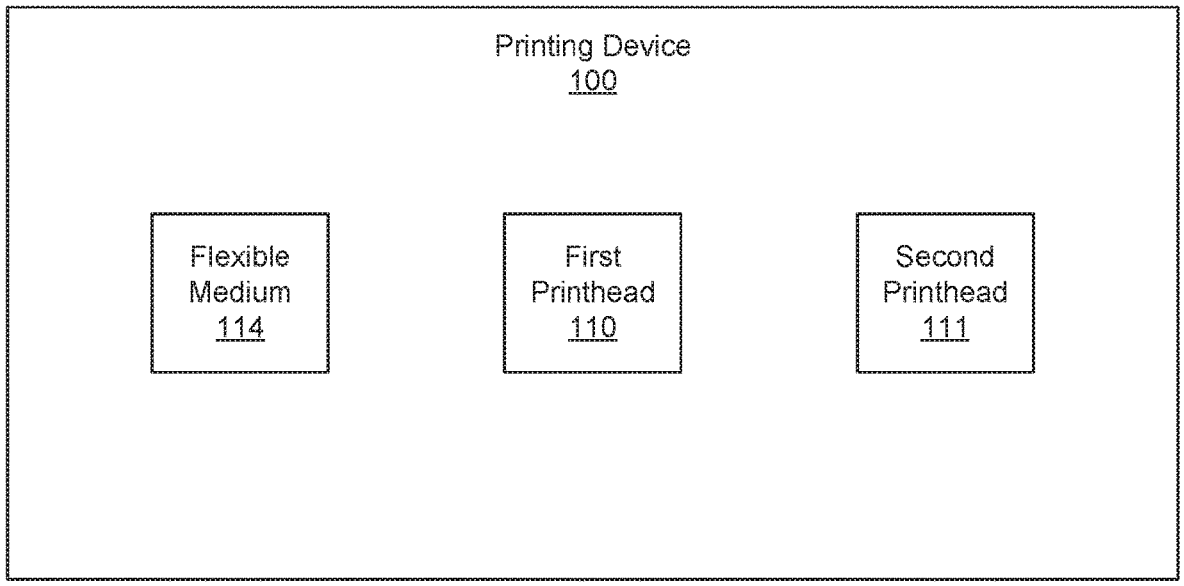
FIG. 1 is a diagram of a printing device for forming a multi-layered printed circuit board (PCB), according to one example of the principles described herein.

A PCB may include a number of layers of conductive and insulating materials that may be laminated together using, for example, heat and adhesives, to form a single object. The layers may include, for example, a number of substrates such as an FR-4 grade designation substrate that includes glass-reinforced epoxy laminate sheets. The layers may also include a number of conductive metal layers or traces where the metal is, for example copper or gold. Further, the layers may include a solder mask layer which may include a thin lacquer-like layer of polymer that may be applied to the metal layer or traces for protection against oxidation and to prevent solder bridges from forming between closely spaced solder pads. A silkscreen layer may be printed where an epoxy ink may be printed to form a protective mask.

In some situations, a PCB designer may wish to create a prototype of a PCB to determine if it is viable and functions for its intended purpose and in an effective and safe manner. However, producing a PCB may include using etching processes that are time consuming and uses expensive and toxic chemical materials and expensive specialized hardware and tooling. Further, personal PCB production in this manner becomes increasingly difficult if more than one layer is intended as part of the PCB construction since bonding the layers together, aligning vias or thru holes, including blind and buried vias is extremely difficult to do outside of a mass production system. Thus, personal or small scale PCB production involves an amount of time and expense that makes such a venture prohibitive for most individuals. As to three-dimensional (3D) printing, although some elements of a PCB may be formed using a 3D printer, these devices are also expensive. Further, the formation of a multilayer PCB may be complicated because doing so involves multilayer alignment of a number of electrical elements, the deposition and alignment of high precision mechanical components, and fine pitch component alignment, among others.

Examples described herein provide a method of forming a multi-layered printed circuit board (PCB). The method may include, with a printing device, delivering a flexible medium to at least one fluid jet printhead. Printing an electrically conductive fluid on the flexible medium. Printing of the electrically conductive fluid may be performed with at least one fluid jet printhead, to form at least one, and in some examples, at least two conductive layers on the flexible medium. With the at least one fluid jet printhead, an electrically insulating fluid may be printed to form at least one insulating layer on the first conductive layer.

In one example, the first and second fluid jet printheads are thermal inkjet (TIJ) printheads. In one example, the first fluid jet printhead and the second fluid jet printhead may be embodied as a multi-chamber printhead where the conductive fluid and the insulating fluid are dispensed from the multi-chamber printhead. In one example, the flexible medium is feedable through a plurality of rollers of the printing device. Further, in one example, the flexible medium comprises paper or plastic.

The method may further include curing the electrically conductive fluid, the electrically insulating fluid, or combinations thereof during the printing. The method may further include printing a curing agent to cure the electrically conductive fluid, the electrically insulating fluid, or combinations thereof.

Examples described herein also provide a system for forming a multi-layered printed circuit board (PCB). The system includes a printing device. The printing device includes at least one flexible medium and at least one fluid jet printhead. The at least one fluid jet printhead includes an electrically conductive fluid for printing on the flexible medium to form at least two conductive layers on the flexible medium, and an electrically insulating fluid for printing between the at least two conductive layers to form a number of insulating layers between the conductive layers.

The flexible medium may be feedable through a plurality of rollers of the printing device. Further, the flexible medium may include paper or plastic. In one example, the at least one fluid jet printhead may be a multi-chamber printhead. In this example, the conductive fluid and the insulating fluid may be dispensed from the multi-chamber printhead. In one example, a curing agent may be printed to cure the electrically conductive fluid, the electrically insulating fluid, or combinations thereof.

Examples described herein also provide a computer program product for forming a multi-layered printed circuit board (PCB). The computer program product may include a computer readable storage medium including computer usable program code embodied therewith. The computer usable program code, when executed by a processor, may interpret computer-aided design (CAD) data received from a computing device as printable instructions.

The printable instructions include data defining positioning of at least two layers of electrically conductive fluid and data defining positioning of at least one insulating layer of electrically insulating fluid between the at least two conductive layers.

The computer usable program code, when executed by the processor, may further instruct movement of a flexible medium to a printable position, instruct a first fluid jet printhead to print the electrically conductive fluid on the flexible medium based on the data defining the positioning of the at least two layers of the electrically conductive fluid, and instruct a second fluid jet printhead to print the electrically insulating fluid based on the data defining the positioning of the at least one insulating layer of the electrically insulating fluid.

The computer program product may further include computer usable program code to, when executed by the processor, instruct a printing device to cure the electrically conductive fluid, the electrically insulating fluid, or combinations thereof. Further, the computer program product may further include computer usable program code to, when executed by the processor, instruct the first and second fluid jet printhead to not print at least a portion of the electrically insulating fluid to form at least one via.

As used in the present specification and in the appended claims, the term "a number of" or similar language is meant to be understood broadly as any positive number comprising 1 to infinity: zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

FIG. 1 is a diagram of a printing device (100) for forming a multi-layered printed circuit board (PCB), according to one example of the principles described herein. The printing device (100) may include a first printhead (110) and a second printhead (111). The first and second printheads (110, 111) may be any digitally addressable inkjet material dispenser. In one example, the first and second printheads (110, 111) may be fluid jet printheads that deposit fluids onto a print medium or other surface. Further, in one example, the first and second printheads (110, 111) may be thermal fluid jet printheads, piezoelectric fluid jet printheads, other types of fluid jetting printheads, and combinations thereof. The first and second printheads (110, 111) and any other type of printhead described herein are digitally addressable such that droplets of fluid may be dispensed from the first and second printheads (110, 111) and any other type of printhead described herein based on an image produced by a computing device and rasterized by a raster image processor (RIP).

In one example, the first printhead (110) may dispense an electrically conductive fluid to form a number of electrically conductive traces, layers, or elements within the PCB. In this example, the electrically conductive fluid dispensed by the first printhead (110) may include, for example, metallic particles that are combined with a polymer in addition to or in place of a pigment. In this example, the metallic particles may be suspended in an oil or solvent solution. When printed, with or without an additional pigment, the electrically conductive fluid may be visible, permitting a user to visually inspect a printed PCB board for proper printing of the electrically conductive fluid. In one example, metallic particles may be less than 100 nm in size. Electrically conductive fluid may include a high concentration of metallic particles where the concentration of metallic particles relative to the polymer is such that when melted and applied to a media substrate, the metallic particles have sufficient contact with one another so as to establish an electrical conductor of the relative shape and size of the area of printed electrically conductive fluid, and provide conduction from one end of the printed pattern to the other. In this manner, the size, shape, and intrinsic conductivity of the particles within the electrically conductive fluid, as well as a printed layer thickness may define the overall conductance of the printed pattern. Some examples of conductive fluids may include: PE410 ink-jet silver conductor; PE-827 silver composite conductor; and PE-828 silver conductor all manufactured and distributed by E. I. du Pont de Nemours and Company. Other examples of conductive fluids may include; 9101 conductive inkjet ink; 9102 conductive inkjet ink: 9103 conductive inkjet ink; and 9104 conductive inkjet ink all manufactured and distributed by Methode Electronics, Inc. Still other examples of conductive fluids may include conductive fluids manufactured and distributed by Mitsubishi Imaging (MPM) Inc. and conductive fluids manufactured and distributed by NovaCentrix, Inc.

Further, in one example, the second printhead (111) may dispense an electrically insulating fluid to form a number of electrically insulting traces, layers, or elements within the PCB. In this example, the electrically insulating fluid dispensed by the second printhead (111) may include, for example, non-conductive particles suspended in an oil or solvent solution. The non-conductive particles may include materials such as oxides, nitrides, and organic insulating fluids or particles. A non-conductive material may be defined as any material that will not conduct electricity under nominal PCB operating conditions. When applied, the insulating fluid may form a layer of insulation of the relative shape and size of the printed electrically insulating fluid. In one example, the electrically insulating fluid may be a polymeric material. In one example, the electrically insulating fluid may include insulator materials such as oxides, nitrides, or organic insulating materials. When printed, with or without an additional pigment, the electrically insulating fluid may be visible, permitting a user to visually inspect a printed PCB board for proper printing of the electrically insulating fluid. In one example, electrically insulating particles may be less than 100 nm in size. Electrically insulating fluid may include a high concentration of electrically insulating particles where the concentration of electrically insulating particles relative to other constituents is such that when applied to a media substrate, the electrically insulating particles have sufficient contact with one another so as to establish an electrical insulation layer of the relative shape and size of the area of printed electrically insulating fluid, and provide insulation between conductive elements from one end of the printed pattern to the other. In this manner, the size, shape, and intrinsic insulation of the particles within the electrically insulating fluid, as well as a printed layer thickness may define the overall effectiveness of the printed pattern. Some examples of insulating fluids may include: PE772 encapsulant manufactured and distributed by E. I. du Pont de Nemours and Company, or LISICON D320-DEC-080 insulating material manufactured and distributed by Merck Group. The electrically insulating fluid may be printed between at least two conductive traces, layers, or other elements within the PCB.

In one example, the first and second printheads (110, 111) may be formed as a single multi-chamber printhead that dispenses both electrically conductive fluid and electrically insulating fluid. In this example, the multi-chamber printhead (110, 111) may include two different types of chambers that are capable of selectively dispersing droplets of both electrically conductive fluid and electrically insulating fluid in turn or simultaneously. The two different types of chambers within the multi-chamber printhead (110, 111) are fluidically coupled to separate fluid paths that feed the respective fluid to the chambers.

A number of sheets of flexible medium are used as a printing substrate within the printing device (100). The flexible medium may be any medium on which the first printhead (110) and the second printhead (111) print their respective electrically conductive fluid and electrically insulating fluid. In one example, the flexible medium may be any thin-film substrate that ranges from fractions of a nanometer to several micrometers in thickness. Further, in one example, the flexible medium (114) may be made of paper, plastic, metal films, other flexible substrate materials, and combinations thereof. In one example, the flexible medium (114) may be made of polyethylene terephthalate (PET) or another thermoplastic polymer. For example, the flexible medium (114) may be made of KAPTON polyimide manufactured and distributed by E. I. du Pont de Nemours and Company.

In printing the multiple layers of the PCB, the printing device (100) includes a number of rollers used to move the flexible medium (114) though the printing device (100). The printing device (100) is capable of moving the flexible medium (114) in at least two opposite relative directions along at least one coordinate axis. In this manner, the printing device (100) is capable of pushing and pulling the flexible medium (114) back and forth in order to form subsequent layers of electrically conductive fluid and electrically insulating fluid on top of previously deposited layers based on the design of the PCB. Further, the printheads (110, 111) are capable of moving across the surface of the flexible medium (114) in at least two opposite relative directions along at least one coordinate axis that is perpendicular to the coordinate axis of movement of the flexible medium (114). In this manner, the printing device (100) is capable of moving the printheads (110, 111) to print on any portion of the flexible medium (114).

In one example, the form factor of the printing device (100) may be a desktop printing device. In this example, a user such as a hobbyist or even professionals may rapidly create prototype, multi-layered PCBs and flexible, complex circuits. Further, these individuals may then utilize an industrial-grade manufacturing services to form either flexible or non-flexible PCBs based on the design that was proven to function for its intended purpose through the printing of the PCB by the printing device (100). Further, these individuals may then utilize a printing system and associated services to form PCBs based on the design that was proven to function for its intended purpose through the printing of the PCB by the printing device (100). These printing systems and associated services may include, for example, an INDIGO digital press designed, manufactured, and distributed by HP Inc.

Figure 2:
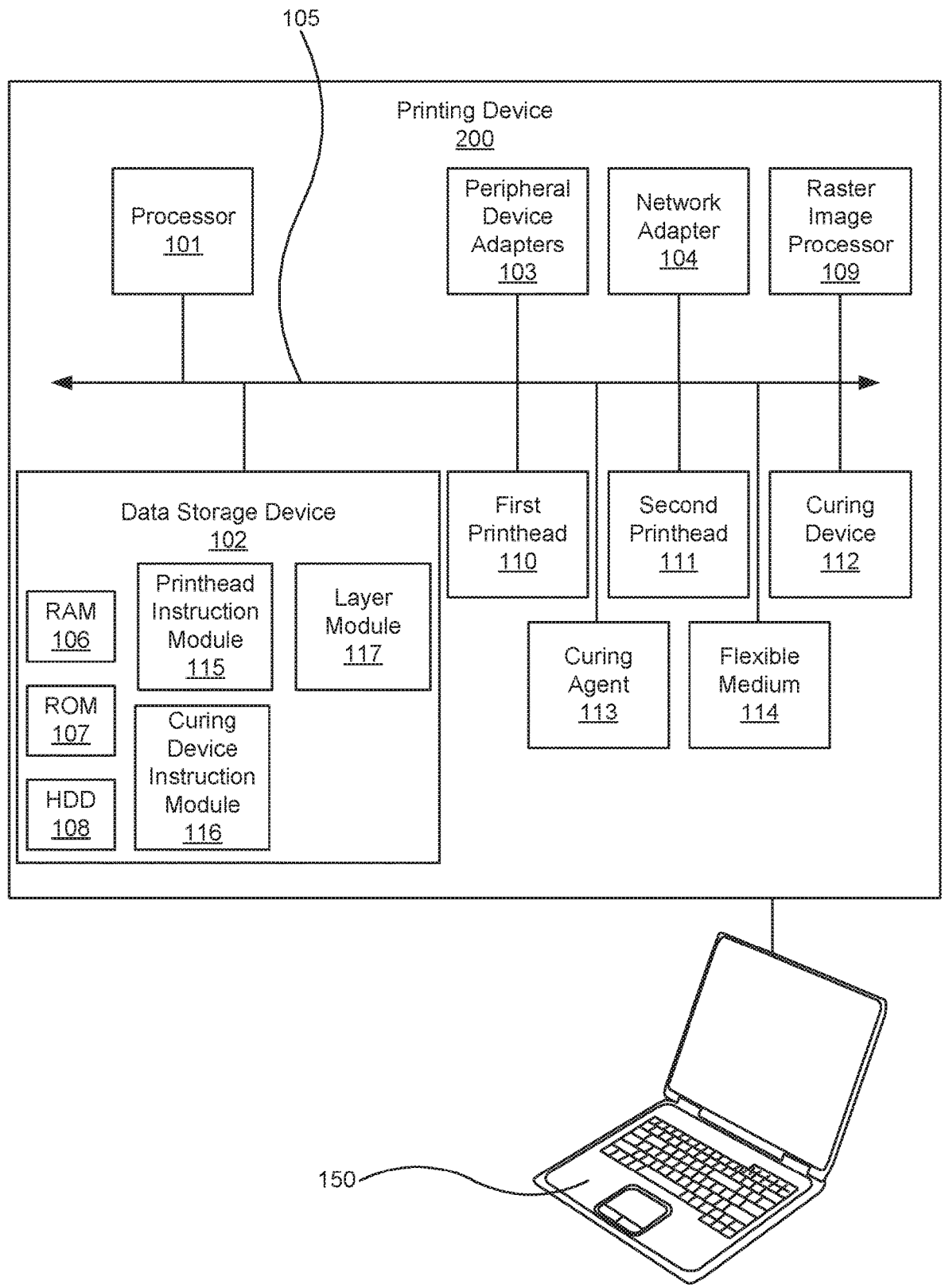
FIG. 2 is a diagram of a printing device for forming a multi-layered printed circuit board (PCB), according to another example of the principles described herein.

FIG. 2 is a diagram of a printing device (200) for forming a multi-layered printed circuit board (PCB), according to another example of the principles described herein. The printing device (200) may be utilized in any data processing scenario including, stand-alone hardware, mobile applications, through a computing network, and combinations thereof. Further, the printing device (200) may be used in a computing network, a public cloud network, a private cloud network, a hybrid cloud network, other forms of networks, and combinations thereof. In one example, the methods provided by the printing device (200) are provided as a service over a network by, for example, a third party. In this example, the service may comprise, for example, the following: a Software as a Service (SaaS) hosting a number of applications; a Platform as a Service (PaaS) hosting a computing platform comprising, for example, operating systems, hardware, and storage, among others; an Infrastructure as a Service (IaaS) hosting equipment such as, for example, servers, storage components, network, and components, among others; application program interface (API) as a service (APIaaS), other forms of network services, and combinations thereof. The present systems may be implemented on one or multiple hardware platforms, in which the modules in the system can be executed on one or across multiple platforms. Such modules can run on various forms of cloud technologies and hybrid cloud technologies or offered as a SaaS (Software as a service) that can be implemented on or off the cloud. In another example, the methods provided by the printing device (200) are executed by a local administrator.

To achieve its desired functionality, the printing device (200) comprises various hardware components. Among these hardware components may be a number of processors (101, 109), a number of data storage devices (102), a number of peripheral device adapters (103), and a number of network adapters (104). These hardware components may be interconnected through the use of a number of busses and/or network connections. In one example, the processor (101), data storage device (102), peripheral device adapters (103), a network adapter (104), and raster image processor (109) may be communicatively coupled via a bus (105).

The processor (101) may include the hardware architecture to retrieve executable code from the data storage device (102) and execute the executable code. The executable code may, when executed by the processor (101), cause the processor (101) to implement at least the functionality of instructing the first printhead (110), the second printhead (111), the curing device (112), and other elements within the printing device (200) to print conductive and insulating elements of a PCB on a flexible medium (114), according to the methods of the present specification described herein. In the course of executing code, the processor (101) may receive input from and provide output to a number of the remaining hardware units.

The data storage device (102) may store data such as executable program code that is executed by the processor (101) or other processing device. As will be discussed, the data storage device (102) may specifically store computer code representing a number of applications that the processor (101) executes to implement at least the functionality described herein.

The data storage device (102) may include various types of memory modules, including volatile and nonvolatile memory. For example, the data storage device (102) of the present example includes Random Access Memory (RAM) (106), Read Only Memory (ROM) (107), and Hard Disk Drive (HDD) memory (108). Many other types of memory may also be utilized, and the present specification contemplates the use of many varying type(s) of memory in the data storage device (102) as may suit a particular application of the principles described herein. In certain examples, different types of memory in the data storage device (102) may be used for different data storage needs. For example, in certain examples the processor (101) may boot from Read Only Memory (ROM) (107), maintain nonvolatile storage in the Hard Disk Drive (HDD) memory (108), and execute program code stored in Random Access Memory (RAM) (106).

Generally, the data storage device (102) may comprise a computer readable medium, a computer readable storage medium, or a non-transitory computer readable medium, among others. For example, the data storage device (102) may be, but not limited to, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random-access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The hardware adapters (103, 104) in the printing device (200) enable the processor (101) to interface with various other hardware elements, external and internal to the printing device (200). For example, the peripheral device adapters (103) and the network adaptor (104) may provide an interface to input/output devices, such as, for example, a computing device (150), a mouse, or a keyboard. The peripheral device adapters (103) may also provide access to other external devices such as an external storage device, a number of network devices such as, for example, servers, switches, and routers, client devices, other types of computing devices, and combinations thereof. The peripheral device adapters (103) may also create an interface between the processor (101) and the computing device (150), or other media output devices. The network adapter (104) may provide an interface to other computing devices within, for example, a network, thereby enabling the transmission of data between the printing device (200) and other devices located within the network.

The raster image processor (RIP) (109) may be any processing device that produces a raster image or bitmap from two-dimensional (2D) or three-dimensional (3D) data. The bitmap includes instructions used by the printing device (200) to produce the printed PCBs. The input to the RIP (109) may be a page description in a high-level page description language such as PostScript (PS), Portable Document Format (PDF), XPS or another bitmap of higher or lower resolution than the output device, or, in the case of 3D data, computer-aided design (CAD) data received from the computing device (150) as printable instructions. In one example, the RIP (109) may apply smoothing or interpolation processes to the input bitmap to generate the output bitmap.

In the case of 3D data received from the computing device (150), in one example, the different layers of conductive and insulting fluids, and curing agent printed by the first and second printheads (110, 111) may be sent to the printing device (200) as a plurality of bitmaps with each bitmap defining a layer within the to-be-printed multilayered PCB.

As mentioned herein, the first and second printheads (110, 111) are used to print conductive and insulating fluids on the flexible medium (114). In one example, the conductive and insulating fluids may be cured using a curing device (112), a curing agent (113), or a combination thereof. In one example, the curing device (112) may be an electromagnetic radiation emission device such as a light or laser source that causes the conductive fluid, the insulating fluid, and combinations thereof cure through hardening. In another example, the curing device (112) may be a fan or other device that produces an airflow over the conductive fluid, the insulating fluid, and combinations thereof to cure these fluids. Still further, the curing device may be any heating element that, when electrically charged, emits radiation in the form of heat through resistive heating. Even still further, the curing device (112) may be any combination of the above types of devices.

The curing agent (113) may be any substance that assist in the curing of the conductive fluid, the insulating fluid, and combinations thereof. In one example, the curing agent may be deposited on the conductive fluid and/or the insulating fluid using a printhead. In this example, the curing agent (113) may be dispersible by a printhead, and at least one of the printheads (110, 111) may be a multi-chamber printhead that contains the conductive fluid or the insulating fluid, and the curing agent. In another example, the curing agent (113) may be dispersible by a printhead, and a third printhead may be used to eject the curing agent (113) onto the conductive fluid and/or the insulating fluid. In still another example, the curing agent (113) may be dispensed onto the conductive fluid and/or the insulating fluid using another dispersion device such as a sprayer.

In one example, the curing agent may form part of the conductive fluid and/or the insulating fluid or may be otherwise incorporated into the conductive fluid, the insulating fluid, or combinations thereof. In this example, the curing agent is applied with the conductive fluid, the insulating fluid, or combinations thereof, and may be curable through the application of air, fluid flow such as air over the printed fluids, radiation of the fluids, other curing processes, or combinations thereof.

The curing agent (113) may be used alone or in conjunction with the curing device (112). In one example, the curing agent (113) may be any material that may, by itself, cause the conductive fluids, insulating fluids, and combinations thereof to cure. In another example, the curing agent (113) may be any material that may, as a catalyst and through the additional use of the curing device (112), cause the conductive fluids, insulating fluids, and combinations thereof to cure.

The printing device (200) further comprises a number of modules used in the implementation of instructing the first printhead (110), the second printhead (111), the curing device (112), and other elements within the printing device (200) to print conductive and insulating elements of a PCB on a flexible medium (114), according to the methods of the present specification described herein. The various modules within the printing device (200) comprise executable program code that may be executed separately. In this example, the various modules may be stored as separate computer program products. In another example, the various modules within the printing device (200) may be combined within a number of computer program products; each computer program product comprising a number of the modules.

The printing device (200) may include a printhead instruction module (115) to, when executed by the processor (101), instruct the printheads (110, 111) to print conductive fluid and insulating fluid onto the flexible medium (114) as it is delivered to the printheads (110, 111). Printing of the conductive and insulating fluids may be performed by a single printhead where this single printhead is a multi-chamber printhead capable of printing both the conductive, insulating fluids, curing agents, or combinations thereof. In another example, the two printheads (110, 111) may each print at least one of the conductive fluid, the insulating fluid, the curing agent, or combinations thereof.

In one example, the printhead instruction module (115) may also, when executed by the processor (101), instruct the printheads (110, 111) or a separate printhead to also dispense a curing agent in examples where the curing agent is used to cure the conductive and insulating fluids. In this example, the curing agent (113) may be dispensed before, during, and/or after a layer of conductive or insulating fluid is dispensed on the flexible medium (114) or another layer of conductive or insulating fluid.

The printing device (200) may also include a curing device instruction module (115) to, when executed by the processor (101), instruct the curing device (112) to cure various printed elements of the PCB including, for example, conductive fluids, insulating fluids, and combinations thereof that are printed on the flexible medium or other layers of the conductive fluids and the insulating fluids. As mentioned herein, the curing device (112) may be any device that emits electromagnetic radiation, heat, and/or airflow to cure the conductive fluids, insulating fluids, and combinations thereof.

The printing device (200) may also include a layer instruction module (115) to, when executed by the processor (101), identify a number of layers within a to-be-printed PCB or other circuit, and, with the RIP (109), define the timing and implementation of the printheads (110, 111), the curing device (112), the curing agent (113), and combinations thereof. In this manner, the layers of the multi-layered PCB or other circuit may be understood by the printing device (200) and formed based on the layers that are to be printed based on the output of the layer module (117) and RIP (109).

Figure 3:
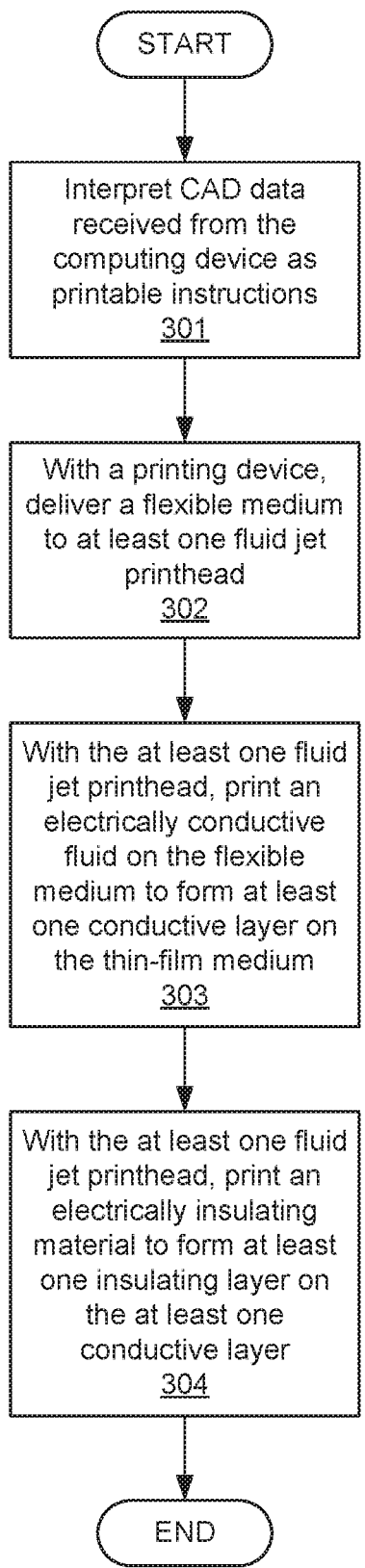
FIG. 3 is a flowchart depicting a method of forming a multi-layered PCB, according to one example of the principles described herein.

FIG. 3 is a flowchart depicting a method of forming a multi-layered PCB, according to one example of the principles described herein. The method of FIG. 3 may include interpreting (block 301) computer-aided design (CAD) data received from the computing device (FIG. 2, 150) as printable instructions. The printable instructions may be interpreted using the RIP (109) and the layer module (117). Interpreting (block 301) the CAD data may include interpreting data defining positioning of at least two layers of electrically conductive fluid, data defining positioning of at least one insulating layer between the at least two conductive traces, and combinations thereof.

The method of FIG. 3 may include instructing (block 302) movement of flexible medium (FIG. 2, 114) to a printable position. The movement of the flexible medium (FIG. 2, 114) may be accomplished using a number of rollers of the printing device (100, 200). As mentioned herein, the printing device (100, 200) may include a number of medium delivery elements such as rollers, pickers, drums, and similar elements that move the flexible medium (114) to a position within the printing device (100, 200) where the printheads (110, 111) can print the conductive and insulating fluids onto the flexible medium (114). These medium delivery elements are able to move the flexible medium (114) relative to the printheads (110, 111) in at least two opposite relative directions along at least one coordinate axis, and the printheads (110, 111) are able to move across the surface of the flexible medium (114) in at least two opposite relative directions along at least one coordinate axis that is perpendicular to the coordinate axis of movement of the flexible medium (114).

The method of FIG. 3 may further include instructing (block 303) a at least one fluid jet printhead (110, 111) to print the electrically conductive fluid on the flexible medium (114) based on the data defining the positioning of the at least two layers of the electrically conductive fluid. In one example the RIP (109) and layer module (117) may be the source of and used to define the positioning of the at least two layers of the electrically conductive fluid.

The method of FIG. 3 may further include instructing (block 304) the at least one fluid jet printhead (110, 111) to print the electrically insulating fluid based on the data defining the positioning of the at least one insulating layer. Again, in one example the RIP (109) and layer module (117) may be the source of and used to define the positioning of the at least one insulating layer of electrically insulating fluid between the at least two conductive layers. In one example, the at least one fluid jet printhead (110, 111) may include a first fluid jet printhead (110), a second fluid jet printhead (111), or more fluid jet printheads.

In the examples described herein, more than one layer or deposition of conductive fluid and insulating fluid may be used to form the respective electrically conductive and electrically insulating elements that are included within the PCB. In this example, curing using the curing device (112) and/or the curing agent (113) may be performed between the depositions. In another example, the curing agent (113) may be part of the electrically conductive fluid, the electrically insulating fluid, or combinations thereof. In another example, a single deposition of conductive fluid or insulating fluid may be sufficient to form the electrically conductive and electrically insulating elements of the PCB.

Figure 4:
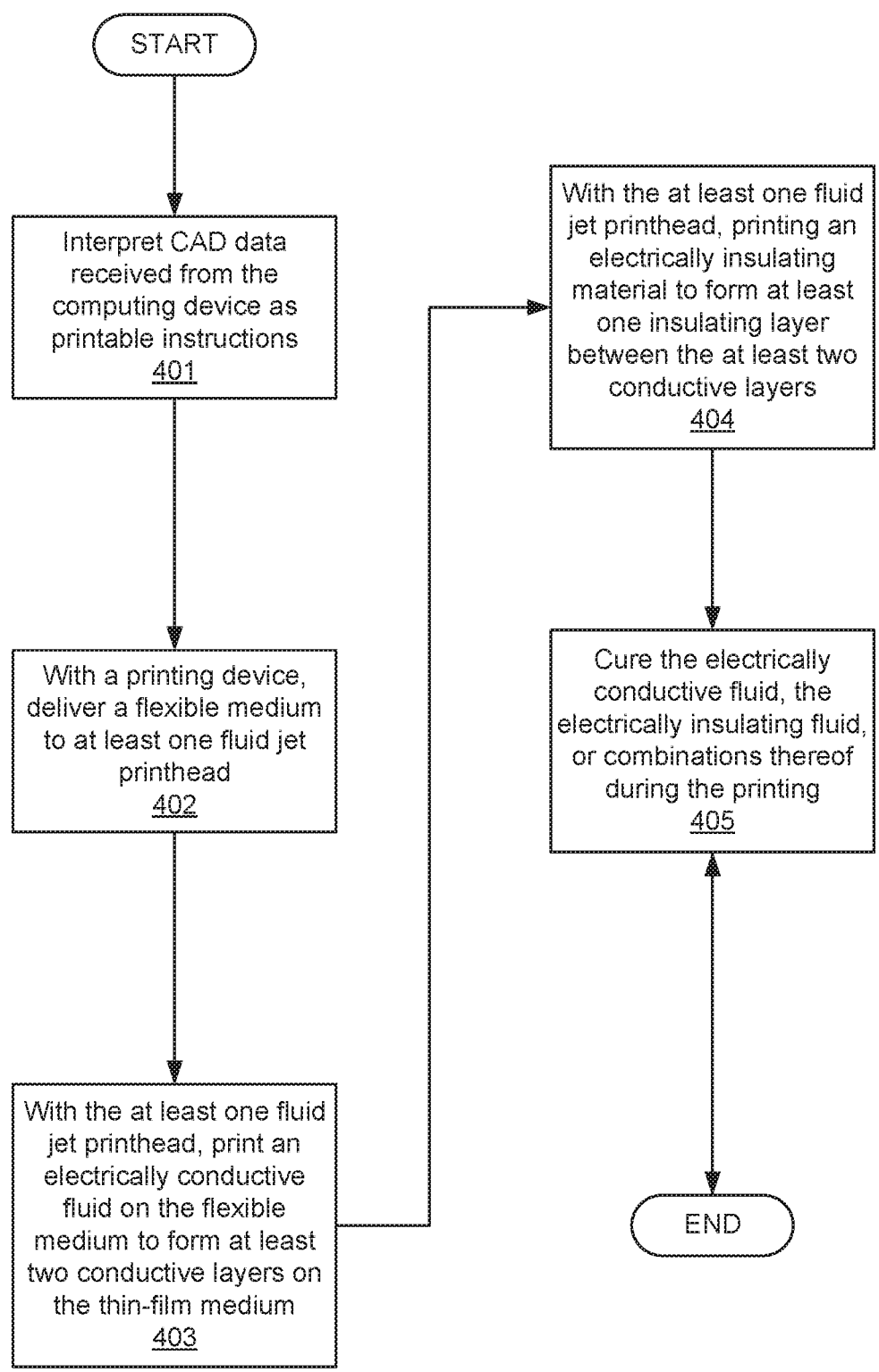
FIG. 4 is a flowchart depicting a method of forming a multi-layered PCB, according to another example of the principles described herein.

FIG. 4 is a flowchart depicting a method of forming a multi-layered PCB, according to another example of the principles described herein. The method of FIG. 4 may include blocks 401 through 404 that are identical to blocks 301 through 305 of FIG. 3 as described herein. The method of FIG. 4 may further include curing (block 405) the electrically conductive fluid, the electrically insulating fluid and combinations thereof during or after printing by the first and second printheads (110, 111). In one example, the curing (block 405) may be performed by the curing device (112) being selectively actuated during the deposition of the electrically conductive fluid and/or the electrically insulating fluid. In another example, the curing (block 405) may be performed by selectively actuating the curing device (112) after at least one deposition of the electrically conductive fluid and/or the electrically insulating fluid occurs. In still another example, the curing (block 405) may be performed during and after a deposition of the electrically conductive fluid and/or the electrically insulating fluid occurs.

Figure 5:
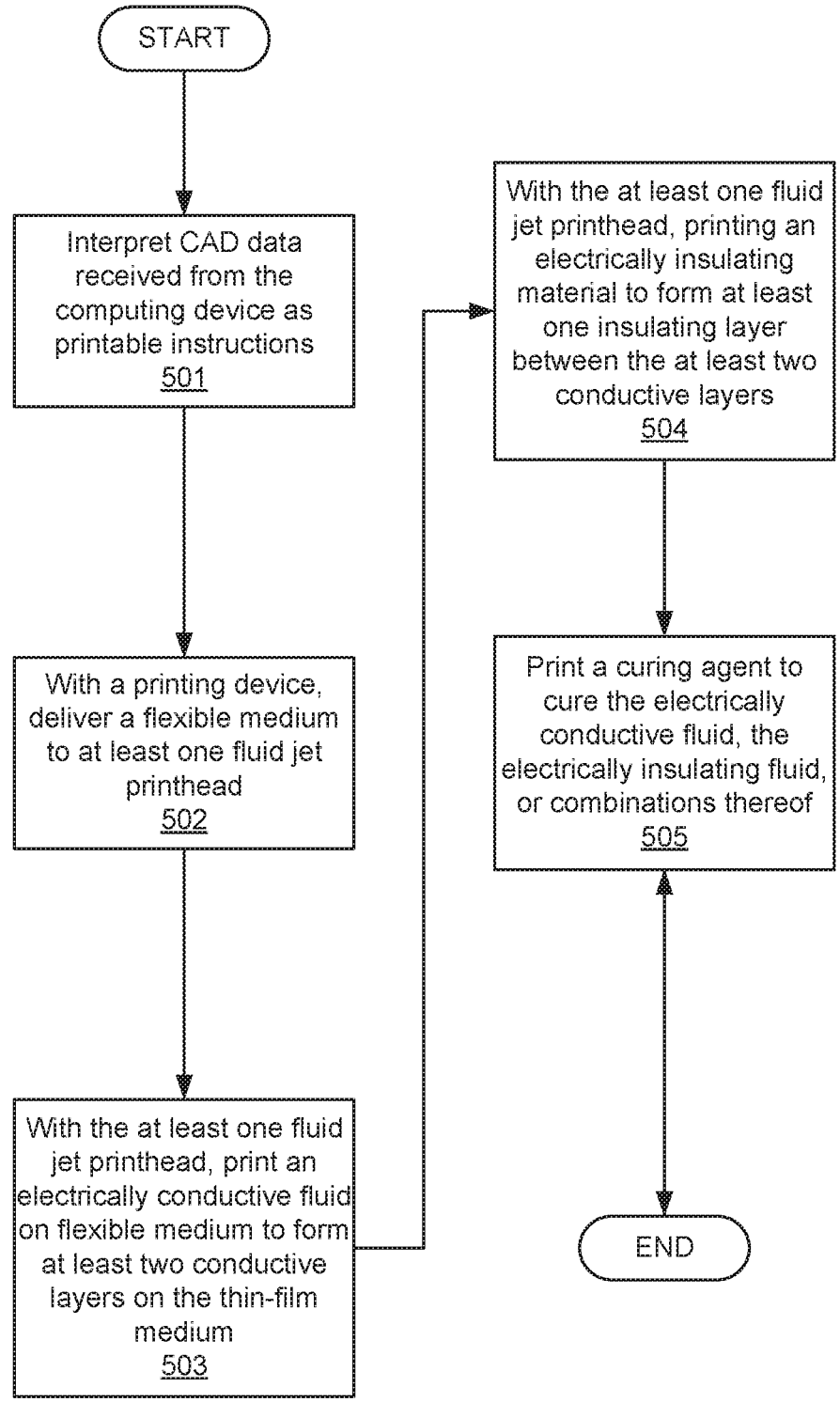
FIG. 5 is a flowchart depicting a method of forming a multi-layered PCB, according to another example of the principles described herein.

FIG. 5 is a flowchart depicting a method of forming a multi-layered PCB, according to another example of the principles described herein. The method of FIG. 5 may include blocks 501 through 504 that are identical to blocks 301 through 305 of FIG. 3 and blocks 401 through 404 of FIG. 4 as described herein. The method of FIG. 5 may further include printing (block 505) a curing agent (113) to cure the electrically conductive fluid, electrically insulating fluid, or combinations thereof. The curing agent (113) may be used alone or in conjunction with the curing device (112) to cure the electrically conductive fluid and/or electrically insulating fluid. Further, as similarly described in connection with the curing device (112) herein, the curing (block 505) may be performed during and/or after a deposition of the electrically conductive fluid and/or the electrically insulating fluid occurs.

Having described the methods of forming a multi-layered PCB, a number of examples of PCBs and their respective elements will now be described in connection with FIGS. 6A through 9B. The elements of a PCB may include, for example, a number of conductive metal layers or traces, a number of electrically insulting traces or layers, a number of vias, a number of soldering points, other elements of a PBC, or combinations thereof. Throughout FIGS. 6A through 9B, a number of separate passes by the printheads (FIG. 2, 110, 111) including a plurality of passes for each layer within the multi-layer PCB may be used to form the elements of the PCB. In one example, the different elements of the PCB may be formed at different levels within the layers so that one deposited layer of fluid may be deposited at a plurality of levels.

The formation of a multilayer PCB may be complicated because doing so involves multilayer alignment of a number of electrical elements, the deposition and alignment of high precision mechanical components, and fine pitch component alignment, among others. The ability to digitally address the deposition of electrically conductive and electrically insulating fluids using the printheads (110, 111) allows for extremely precise depositions of electrically conductive and electrically insulating fluids and formations of the electrical elements of the PCB.

Figure 6A:
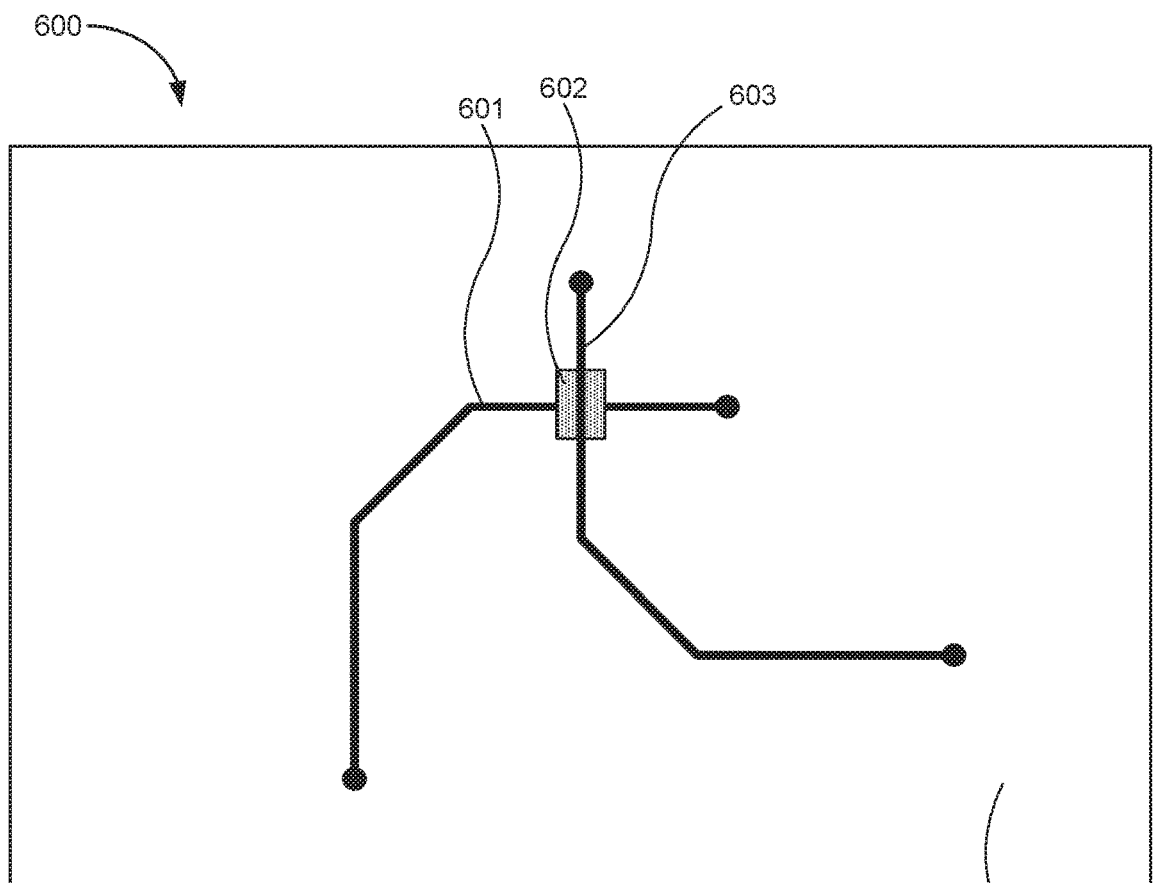
FIG. 6A is a diagram of a top view of a multi-layered PCB printed using the printing device of FIG. 1 or 2, according to one example of the principles described herein.
Figure 6B:
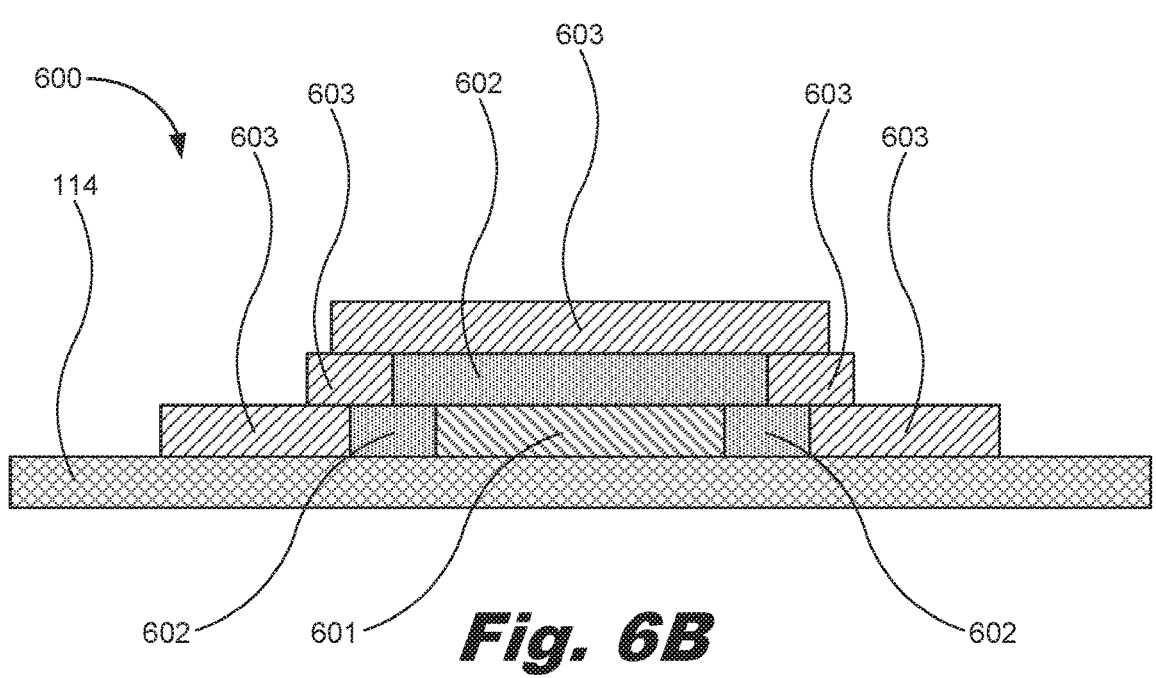
FIG. 6B is a diagram of a side view of the multi-layered PCB of FIG. 6A, according to one example of the principles described herein.

FIG. 6A is a diagram of a top view of a multi-layered PCB (600) printed using the printing device (100, 200) of FIG. 1 or 2, according to one example of the principles described herein. FIG. 6B is a diagram of a side view of the multi-layered PCB (600) of FIG. 6A, according to one example of the principles described herein. The PCB of FIGS. 6A and 6b includes a flexible medium (114) as a substrate. A first electrical trace (601) may be formed on the flexible medium (114) by depositing the electrically conductive fluid using the first printhead (110) and based on the 3D data provided by the computing device (FIG. 2, 150) and processed by the processor (FIG. 2, 101), the RIP (FIG. 2, 109), and the layer module (FIG. 2, 117). Use of the curing device (112), deposition of the curing agent (113) on the electrically conductive fluid, or both may be performed in order to cure the electrically conductive fluid and finish the first electrical trace (601).

A layer of insulation (602) may be formed on the first electrical trace (601) by depositing the electrically insulating fluid using the second printhead (111) and based on the 3D data provided by the computing device (FIG. 2, 150) and processed by the processor (FIG. 2, 101), the RIP (FIG. 2, 109), and the layer module (FIG. 2, 117). In one example, the electrically insulating fluid may be deposited along the length of the first electrical trace (601) to completely insulate the entirety of the first electrical trace (601). In another example, and as depicted in FIG. 6A, the electrically insulating fluid may be deposited on portions of the first electrical trace (601) where other electrically conductive elements such as a second electrical trace (603) are to be printed and overlap with or abut the first electrical trace (601). In one example, the electrically insulating fluid may be deposited over the first electrical trace (601) so as to avoid current leak. Further, like the first electrical trace (601), use of the curing device (112), deposition of the curing agent (113) on the electrically conductive fluid, or both may be performed in order to cure the electrically insulating fluid and finish the layer of insulation (602).

A second electrical trace (603) may be formed on the layer of insulation (602) by depositing the electrically conductive fluid using the first printhead (110) based on the 3D data provided by the computing device (FIG. 2, 150) and processed by the processor (FIG. 2, 101), the RIP (FIG. 2, 109), and the layer module (FIG. 2, 117). The second electrical trace (603) may be printed at any angle relative to the first electrical trace (601) such as, for example, between parallel and perpendicular to the first electrical trace (601). In the example of FIGS. 6A and 6B, the second electrical trace (603) is printed at an angle approximately perpendicular to the first electrical trace (601). Again, use of the curing device (112), deposition of the curing agent (113) on the electrically conductive fluid, or both may be performed in order to cure the electrically conductive fluid and finish the second electrical trace (603).

Like in the examples of FIGS. 6A and 6B, the elements of the PBCs of FIGS. 7A through 9B may be formed and printed based on the 3D data provided by the computing device (FIG. 2, 150) and processed by the processor (FIG. 2, 101), the RIP (FIG. 2, 109), and the layer module (FIG. 2, 117). Further, like in the examples of FIGS. 6A and 6B, the elements of the PBCs of FIGS. 7A through 9B may be cured during or after deposition through the use of the curing device (112), deposition of the curing agent (113) on the electrically conductive fluid, or both, With this information, the examples of FIGS. 7A through 9B will now be described.

Figure 7A:
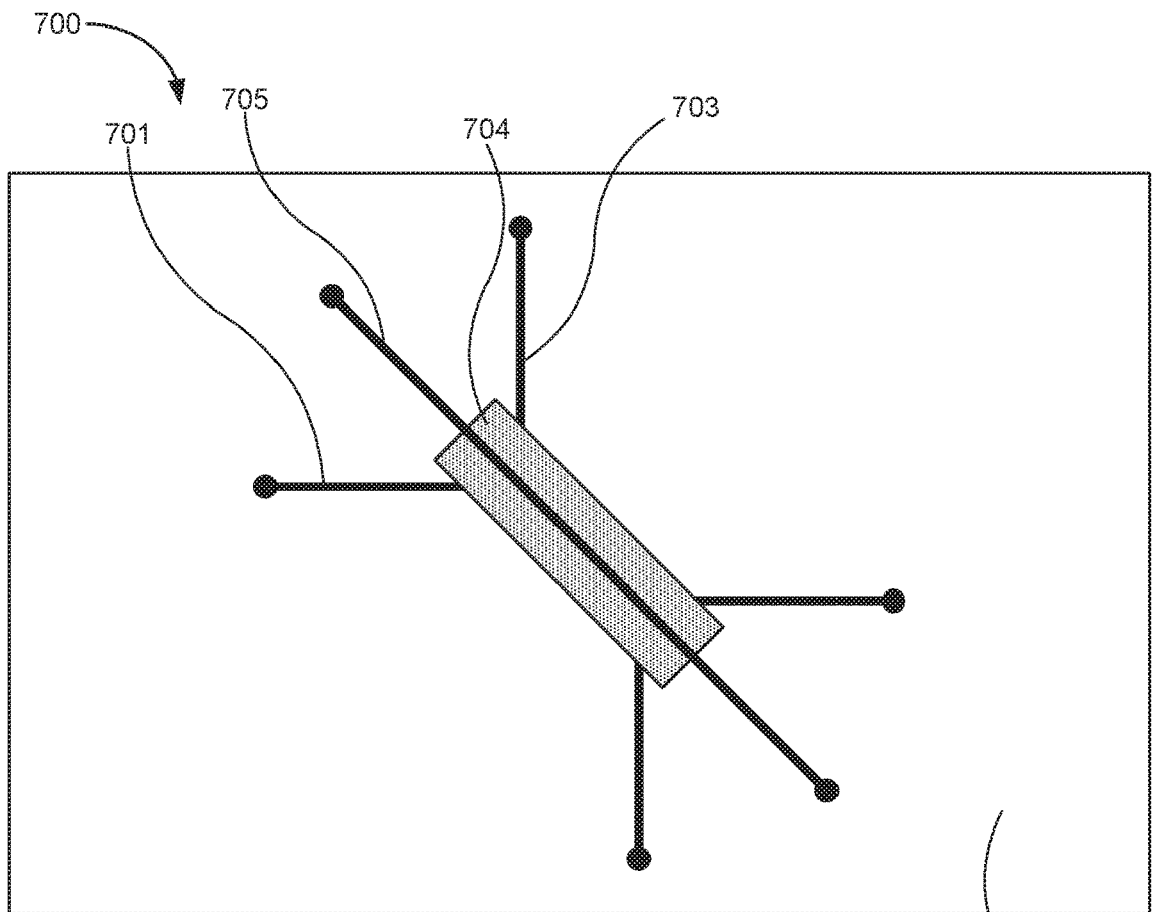
FIG. 7A is a diagram of a top view of a multi-layered PCB printed using the printing device of FIG. 1 or 2, according to one example of the principles described herein.
Figure 7B:
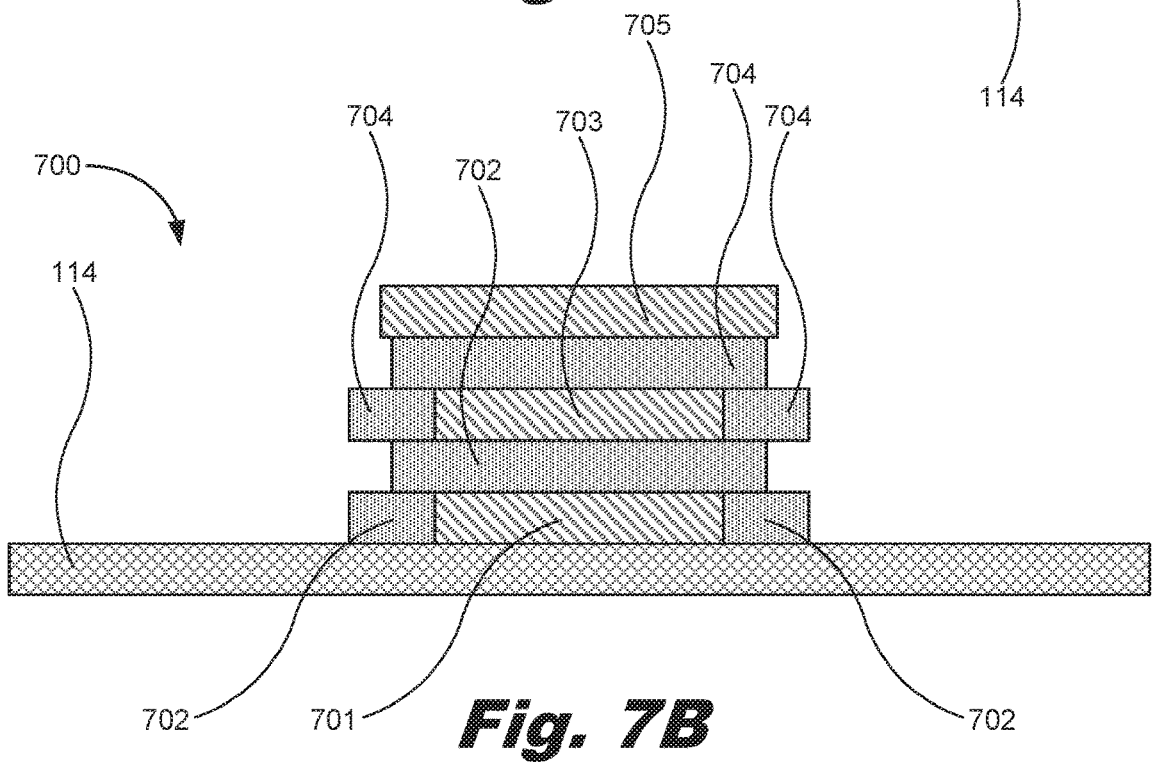
FIG. 7B is a diagram of a side view of the multi-layered PCB of FIG. 7A, according to one example of the principles described herein.

FIG. 7A is a diagram of a top view of a multi-layered PCB (700) printed using the printing device (100, 200) of FIG. 1 or 2, according to one example of the principles described herein. FIG. 7B is a diagram of a side view of the multi-layered PCB (700) of FIG. 7A, according to one example of the principles described herein. In the example of FIGS. 7A and 7B, three electrical traces (701, 703, 705) are formed with two layers of electrical insulation (702, 704) between each of them. A first electrical trace (701) may be formed on the flexible medium (114) by depositing the electrically conductive fluid using the first printhead (110). A first layer of insulation (702) may be formed on the first electrical trace (701) by depositing the electrically insulating fluid using the second printhead (111). In one example, the electrically insulating fluid may be deposited in order to fully encapsulate the first electrical trace (701), and may be printed on the flexible medium (114) as well. A second electrical trace (703) may be formed on the first layer of insulation (702) by depositing the electrically conductive fluid using the first printhead (110). A second layer of insulation (704) may be formed on the second electrical trace (701) by depositing the electrically insulating fluid using the second printhead (111). A third electrical trace (703) may be formed on the first layer of insulation (702) by depositing the electrically conductive fluid using the first printhead (110).

The example of FIGS. 7A and 7B demonstrate that a large number of layers of PCB elements may be deposited one on top of one another. In one example, the maximum number of layers printed on the flexible medium (114) may be defined by the resulting thickness of the layers collectively, characteristics of the printheads (110, 111), the distance between the printheads (110, 111) and the flexible medium (114), the ability or lack thereof of the printheads (110, 111) and/or the flexible medium (114) to move apart from one another, other factors, or combinations thereof. In one example, the number of layers that may have a thickness of between fractions of a nanometer to several micrometers. In another example, the number of layers that may have a thickness defined by an effective conductance or effective insulation of the respective layers, and may be based on the size, shape, and intrinsic conductivity of the particles within the electrically conductive fluid and the electrically insulating fluid.

Figure 8A:
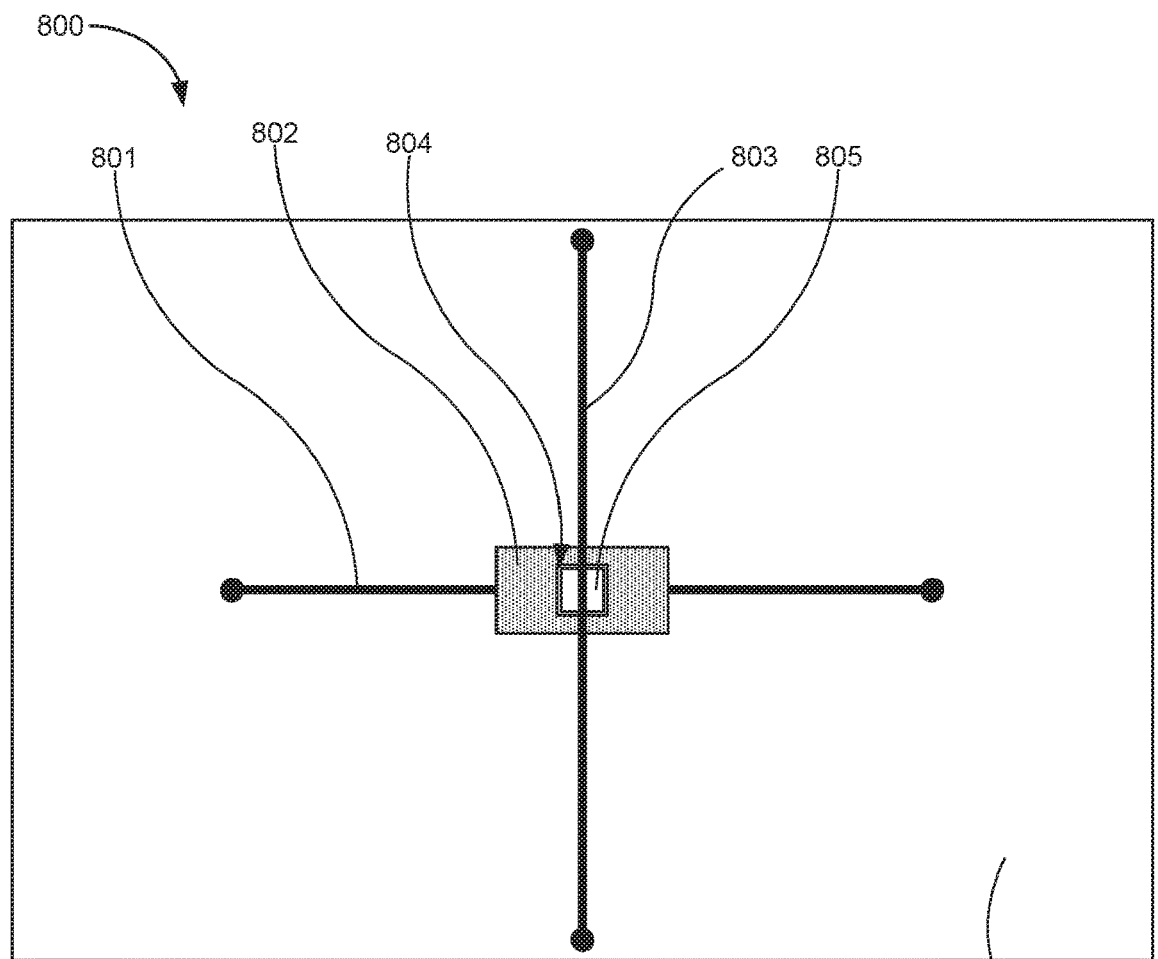
FIG. 8A is a diagram of a top view of a multi-layered PCB printed using the printing device of FIG. 1 or 2, according to one example of the principles described herein.
Figure 8B:
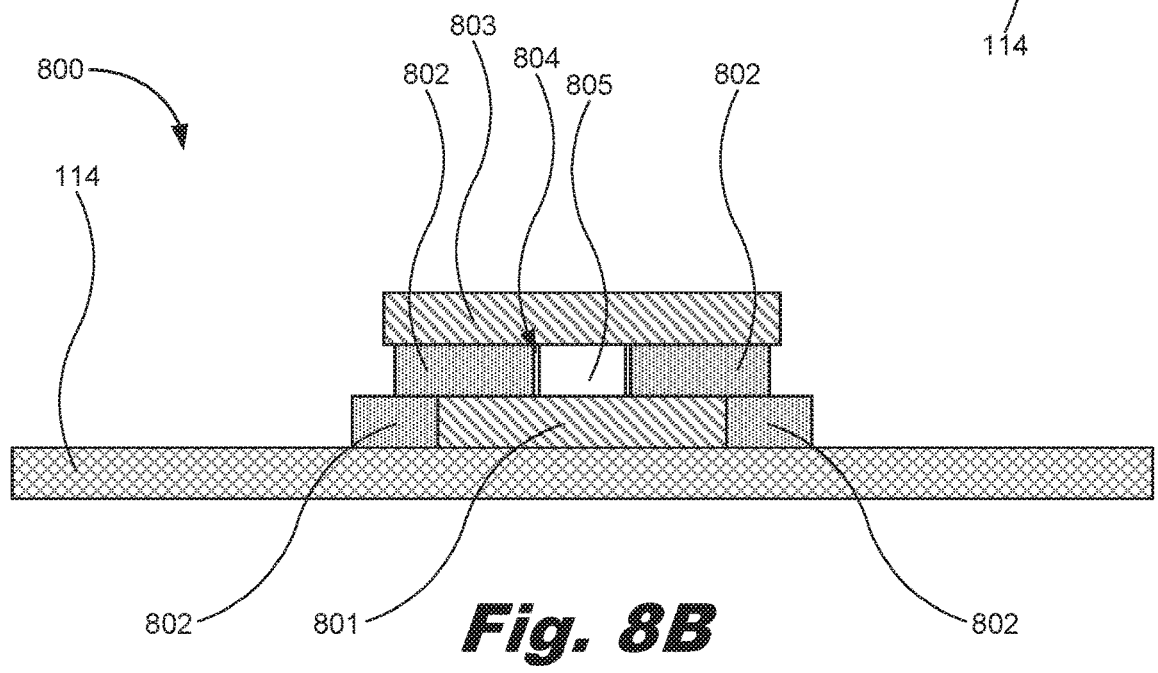
FIG. 8B is a diagram of a side view of the multi-layered PCB of FIG. 8A, according to one example of the principles described herein.

FIG. 8A is a diagram of a top view of a multi-layered PCB (800) printed using the printing device (100, 200) of FIG. 1 or 2, according to one example of the principles described herein. FIG. 8B is a diagram of a side view of the multi-layered PCB (800) of FIG. 8A, according to one example of the principles described herein. In the example of FIGS. 8A and 8B, two electrical traces (801, 803) are formed with a layer of electrical insulation (802) between the two electrical traces (801, 803) and a via (804) defined in the layer of electrical insulation (802). A via is any electrical connection between layers in a physical electronic circuit such as a PCB that goes through the plane of at least one adjacent layer. In the example of FIGS. 8A and 8B, first electrical trace (801) may be formed on the flexible medium (114) by depositing the electrically conductive fluid using the first printhead (110). A layer of insulation (802) may be formed on the first electrical trace (801) by depositing the electrically insulating fluid using the second printhead (111). When depositing the layer of insulation (802), the printing device (100, 200) may leave a portion of the layer of insulation (802) left undeposited to form a via (804) or hole through the layer of insulation (802). In order to electrically couple the first electrical trace (801) to a second electrical trace (803), the via (804) may be filled with electrically conductive fluid using the first printhead (110) to form a barrel (805). The barrel (805) is depicted in the drawings with a different fill than, for example, the two electrical traces (801, 803) in order to differentiate between structures. However, in one example, the barrel (805) is formed by printing the electrically conductive fluid using the first printhead (110) inside the via (804). In this manner, the via (804) and the barrel (805) together form an electrical connection between layers within the PCB. The second electrical trace (803) may be formed on the layer of insulation (802) and the via (804) and barrel (805) by depositing the electrically conductive fluid using the first printhead (110). In this manner, the first electrical trace (801) is electrically coupled to the second electrical trace (803) through the barrel (805) printed within the via (804).

Figure 9A:
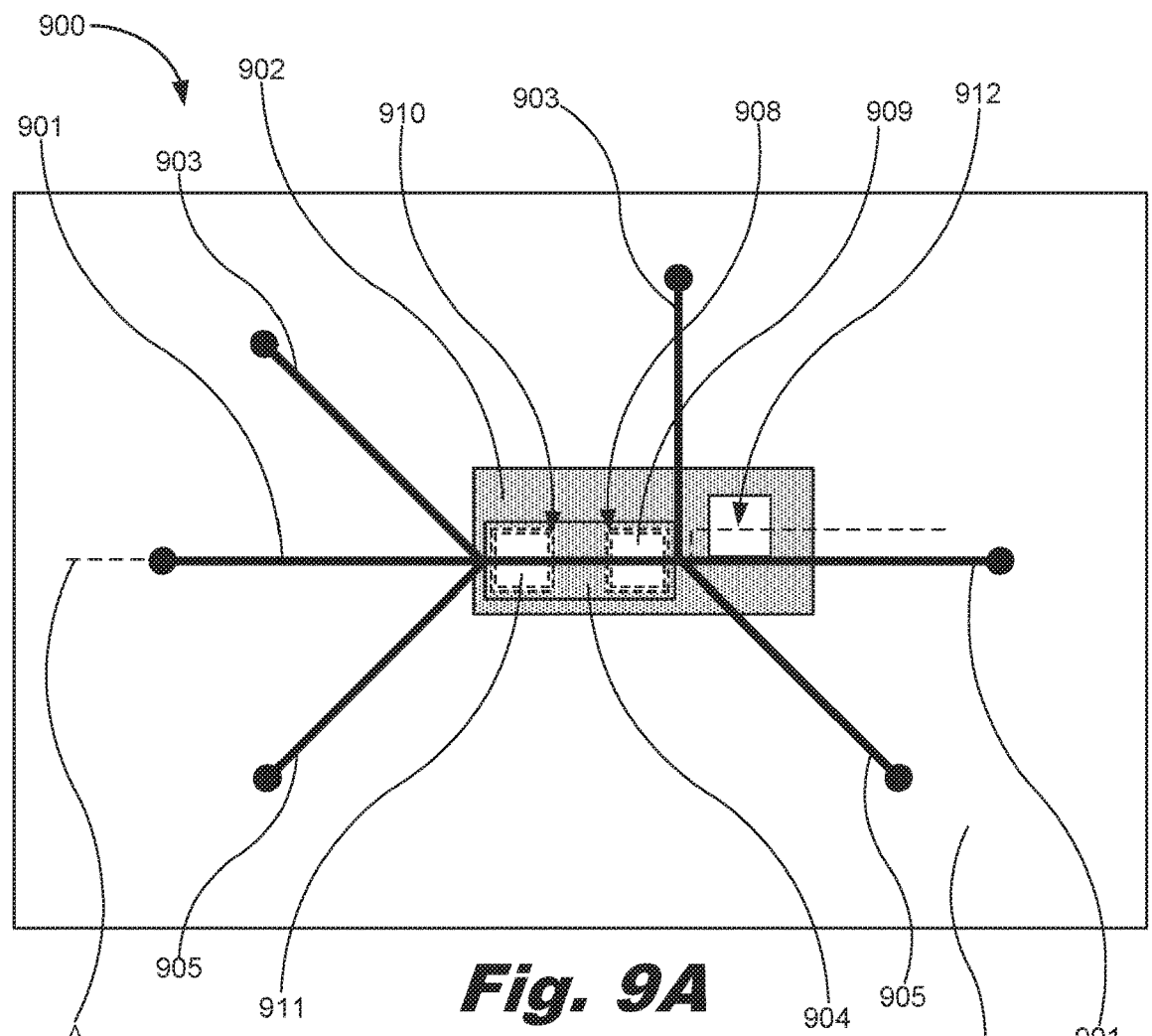
FIG. 9A is a diagram of a top view of a multi-layered PCB printed using the printing device of FIG. 1 or 2, according to one example of the principles described herein.
Figure 9B:
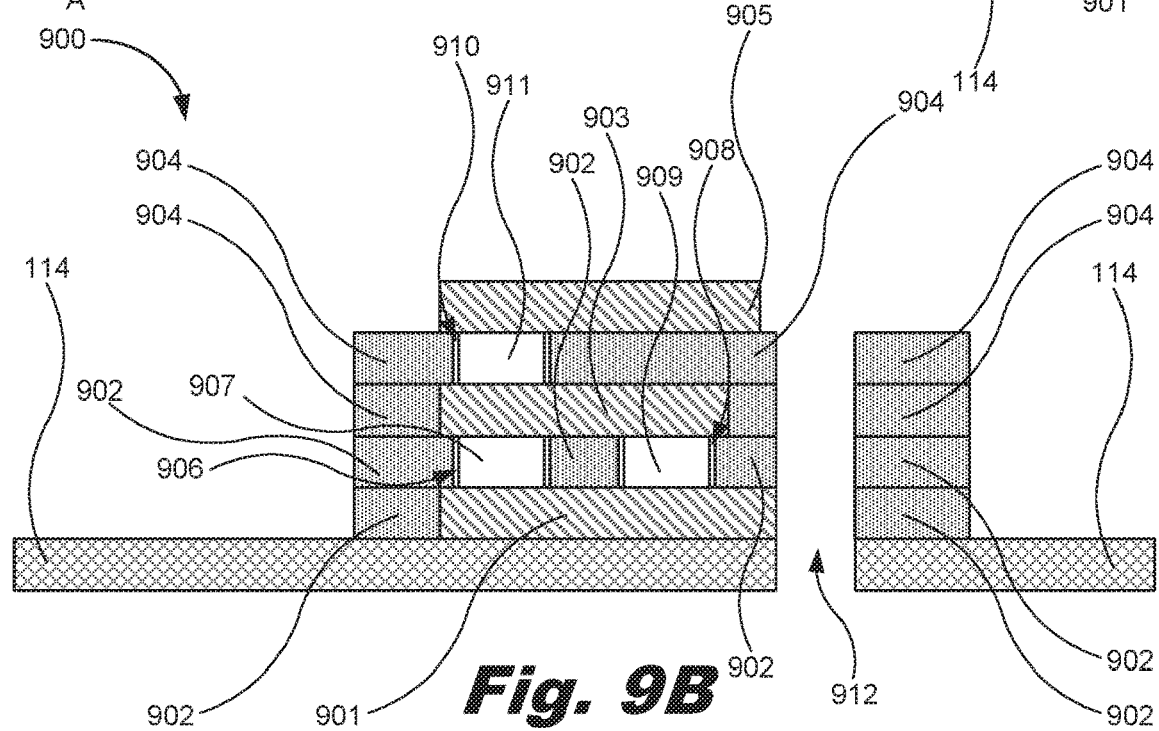
FIG. 9B is a diagram of a side view of the multi-layered PCB of FIG. 9A, according to one example of the principles described herein.

FIG. 9A is a diagram of a top view of a multi-layered PCB printed using the printing device of FIG. 1 or 2, according to one example of the principles described herein. FIG. 9B is a diagram of a side view of the multi-layered PCB of FIG. 9A along line A, according to one example of the principles described herein. In the example of FIGS. 9A and 9B, three electrical traces (901, 903, 905) are formed with two layers of electrical insulation (902, 904) between the three electrical traces (901, 903, 905) and three vias (906, 908, 910) defined in the layers of electrical insulation (902, 904). In the example of FIG. 9A, the three electrical traces (901, 903, 905) are depicted as one line due to the manner in which they are stacked on one another, but in FIG. 9B, these electrical traces (901, 903, 905) are all individually depicted. The vias (906, 908) formed between the first electrical trace (901) and the second electrical trace (903) may be referred to as buried vias that connect internal layers without being exposed to either surface of the PCB. In another example, blind vias that are exposed to one side of the PCB but not another side of the PCB may also be formed in the PCB.

In the example of FIGS. 9A and 9B, first electrical trace (901) may be formed on the flexible medium (114) by depositing the electrically conductive fluid using the first printhead (110). A first layer of insulation (902) may be formed on the first electrical trace (901) by depositing the electrically insulating fluid using the second printhead (111). When depositing the layer of insulation (902), the printing device (100, 200) may leave a portion of the layer of insulation (902) left undeposited in two separate areas to form two of the three vias (906, 908) through the layer of insulation (902). In order to electrically couple the first electrical trace (901) to the second electrical trace (903), the vias (906, 908) may be filled with electrically conductive fluid using the first printhead (110) to form two separate barrels (907, 909). The second electrical trace (903) may be formed on the layer of insulation (902) and the vias (906, 908) and barrels (907, 909) by depositing the electrically conductive fluid using the first printhead (110). In this manner, the first electrical trace (901) is electrically coupled to the second electrical trace (903) through the barrels (907, 909) printed within the vias (906, 908).

A second layer of insulation (904) may be formed on the second electrical trace (901) by depositing the electrically insulating fluid using the second printhead (111). When depositing the layer of insulation (902), the printing device (100, 200) may leave a portion of the layer of insulation (902) left undeposited in one area to form the third of the three vias (910) through the layer of insulation (904). In order to electrically couple the second electrical trace (903) to the third electrical trace (905), the third via (910) may be filled with electrically conductive fluid using the first printhead (110) to form a third barrel (911). The third electrical trace (905) may be formed on the second layer of insulation (904) and the via (910) and barrel (911) by depositing the electrically conductive fluid using the first printhead (110). In this manner, the second electrical trace (903) is electrically coupled to the third electrical trace (905) through the barrel (911) printed within the via (910). In this manner, blind and buried vias and barrels may be formed in the PCB through selective printing.

In one example, a number of through-holes (912) may be defined in the PCB (900). A through-hole (912) may be any void that is formed entirely through the PCB and may be used to mount the PCB to another device or to mount a number of electronic components such as resistors that involve the use of leads on the electronic components that are inserted into through-holes (912). These electronic components may be soldered to traces, pads, or other conductive elements on the opposite side of the PCB. When depositing the three electrical traces (901, 903, 905) and the layers of electrical insulation (902, 904), an empty space may be left unprinted in these layers to define the through-hole (912). In one example, a matching hole may be formed in the flexible medium (114) to allow for the through-hole (912) to extend through the entirety of the PCB (112). In one example, the matching hole formed in the flexible medium (114) may be formed prior to the printing of any number of the layers including the electrical traces (901, 903, 905) and electrical insulation (902, 904). In another example, the matching hole formed in the flexible medium (114) may be formed after the printing has completed. In still another example, the printing device may include a hole punch to form the matching hole in the flexible medium (114) during the printing process.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general-purpose computer, special purpose computer, or other programmable data processing apparatus to produce a machine, such that the computer usable program code, when executed via, for example, the processor (101) or the RIP (109) of the printing device (100, 200) or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

The specification and figures describe a method of forming a multi-layered printed circuit board (PCB). The method may include, with a printing device, delivering a flexible medium to at least one fluid jet printhead. Printing an electrically conductive fluid on the flexible medium may be performed with at least one fluid jet printhead, to form a first conductive layer on the flexible medium. With the at least one fluid jet printhead, an electrically insulating fluid may be printed on the first conductive layer to form at least one insulating layer on the first conductive layer. With the at least one fluid jet printhead, the electrically conductive fluid may be printed on the at least one insulating layer to form a second conductive layer.

The systems and methods for forming a multi-layered PCB described herein are safer to manufacture since toxic chemicals used to otherwise form a PCB are not used. Further, these systems and methods provide a powerful tool for hobbyists and professionals to rapidly create prototypes and complex, flexible circuits and PCBs. These systems and methods may serve as an entry level manufacturing tool for professionals and hobbyists to prove functioning and efficacy of prototype circuits and PCBs, while allowing for industrial grade printing services to produce more circuits and PCBs based on these prototypes. This, in turn, allows the user to quickly transit from low volume production setting to a higher volume printing platform in a quick and integrated way and without the risk of lost development time and costs associated with an expensive industrial PCB manufacturing run.

The preceding description has been presented to illustrate and describe examples of the principles described. This description is not intended to be exhaustive or to limit these principles to any precise form disclosed. Many modifications and variations are possible in light of the above teaching.

What is claimed is:

1. A method of forming a multi-layered printed circuit board (PCB) comprising:
    with a printing device, delivering a medium to at least one fluid jet printhead;
    with at least one fluid jet printhead, printing an electrically conductive fluid on the medium to form a first conductive layer on the medium;
    with the at least one fluid jet printhead, printing an electrically insulating fluid on the first conductive layer to form at least one insulating layer on the first conductive layer; and
    with the at least one fluid jet printhead, printing the electrically conductive fluid on the at least one insulating layer to form a second conductive layer.

2. The method of claim 1, wherein the at least one fluid jet printhead is thermal inkjet (TIJ) printheads.

3. The method of claim 1, wherein the medium is a flexible medium and is feedable through a plurality of rollers of the printing device.

4. The method of claim 1, further comprising, with a medium delivery system, selectively moving the medium in two opposing directions by pushing and pulling the medium relative to the at least one fluid jet printhead for formation of elements of the multi-layered PCB on the medium.

5. The method of claim 1, further comprising curing the electrically conductive fluid, the electrically insulating fluid, or combinations thereof during the printing.

6. The method of claim 1, wherein the at least one fluid jet printhead is a multi-chamber printhead, and
    wherein the conductive fluid and the insulating fluid are dispensed from the multi-chamber printhead.

7. The method of claim 1, further comprising printing a curing agent to cure the electrically conductive fluid, the electrically insulating fluid, or combinations thereof.

8. The method of claim 1, further comprising, accessing a computer readable storage medium comprising computer usable program code embodied therewith, the computer usable program code to, when executed by a processor of the printing device:
    interpret computer-aided design (CAD) data received from a computing device as printable instructions, the printable instructions comprising:
        data defining positioning of at least two layers of electrically conductive fluid; and
        data defining positioning of at least one insulating layer of electrically insulating fluid between the at least two conductive layers;
    instruct movement of the medium to a printable position;
    instruct at least one fluid jet printhead to print the electrically conductive fluid on the medium based on the data defining the positioning of the at least two layers of the electrically conductive fluid; and
    instruct the at least one fluid jet printhead to print the electrically insulating fluid based on the data defining the positioning of the at least one insulating layer of the electrically insulating fluid.

9. The method of claim 8, further comprising using the computer usable program code to, when executed by the processor, instruct the printing device to cure the electrically conductive fluid, the electrically insulating fluid, or combinations thereof.

10. The method of claim 1, further comprising, with the at least one fluid jet printhead, not printing electrically insulating fluid at a location of a via in an insulating layer so as to form at least one via through that insulating layer of the PCB.

11. The method of claim 10, wherein the via is a buried via.

12. The method of claim 1, further comprising printing the electrically conductive fluid with a pigment to enable visual inspection of the first conductive layer.

13. The method of claim 1, further comprising:
with a layer instruction module executed by a processor, identifying the first and second conductive layers and the at least one insulating layer from data describing the PCB; and
with a Raster Image Processor (RIP), defining timing of operation of the at least one fluid jet printhead to print the layers of the PCB.

14. The method of claim 1, further comprising printing either of the insulating fluid of an insulating layer or the conductive fluid of a conductive layer at a plurality of different levels relative to the medium.

15. The method of claim 14, further comprising printing the insulating fluid of an insulating layer to encapsulate above and laterally an underlying conductive layer.

16. The method of claim 1, further comprising:
not printing any of the conductive fluid or insulating fluid at a location of a through-hole in the PCB; and
punching a hole through the medium at the location of the through-hole.

* * * * *